United States Patent
Shah et al.

(10) Patent No.: US 6,812,485 B2
(45) Date of Patent: Nov. 2, 2004

(54) DUAL INTERPOSER PACKAGING FOR HIGH DENSITY INTERCONNECT

(75) Inventors: Sharad M. Shah, San Jose, CA (US); David R. Bach, Shrewsbury, MA (US); Angelo Villani, Shrewsbury, MA (US); Nicholas Palmer, Rutland, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 404 days.

(21) Appl. No.: 10/033,990

(22) Filed: Dec. 28, 2001

(65) Prior Publication Data

US 2003/0123231 A1 Jul. 3, 2003

(51) Int. Cl.[7] .............................................. H01L 23/50
(52) U.S. Cl. ..................... 257/48; 257/778; 361/767; 361/768; 324/755; 324/765
(58) Field of Search ................................ 257/686, 693, 257/697, 698, 700, 701, 723, 724, 737, 738, 778, 48; 361/767–771, 760, 803; 324/754, 755, 757, 758, 761, 765

(56) References Cited

U.S. PATENT DOCUMENTS

| | | | |
|---|---|---|---|
| 5,477,160 A | * 12/1995 | Love | 324/755 |
| 5,544,311 A | 8/1996 | Harenberg et al. | 714/40 |
| 5,929,646 A | 7/1999 | Patel et al. | 324/754 |
| 6,020,749 A | * 2/2000 | Morris et al. | 324/755 |
| 6,081,429 A | * 6/2000 | Barrett | 361/767 |
| 6,125,042 A | 9/2000 | Verdi et al. | 361/760 |
| 6,142,683 A | 11/2000 | Madduri | 395/704 |
| 6,185,732 B1 | 2/2001 | Mann et al. | 717/4 |
| 6,319,829 B1 | * 11/2001 | Pasco et al. | 438/678 |
| 6,335,491 B1 | * 1/2002 | Alagaratnam et al. | 174/260 |
| 6,657,134 B2 | * 12/2003 | Spielberger et al. | 174/260 |

* cited by examiner

Primary Examiner—John B. Vigushin

(57) ABSTRACT

A method and apparatus that allows additional contact pads to be added to a package to support debug and test operations is disclosed. In a preferred embodiment, a circuit board apparatus includes a semiconductor package and an interposer for receiving the semiconductor package. The semiconductor package preferably includes a substrate having a matrix of conductive contact pads on both the top and bottom surfaces of the substrate. The interposer preferably includes a body having a matrix of interposer contact bumps on both the inner and outer surfaces of the body. Each interposer contact bump preferably includes a metal coating and is shaped to abut a contact pad of the semiconductor package.

17 Claims, 3 Drawing Sheets

DUAL INTERPOSER PACKAGING FOR HIGH DENSITY INTERCONNECT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to semiconductor devices, and more specifically relates to testing and debugging semiconductor devices.

2. Discussion of the Related Art

A variety of packaging styles are known for semiconductor devices. Through-hole packages and surface mount packages such as peripheral leaded and area arrays are examples of several semiconductor package styles. These package styles, however, become problematic at higher operating frequencies.

More specifically, at high frequencies, even the relatively short leads of standard surface mount and through-hole mount integrated circuit (IC) packages tend to act like antennas, radiating electromagnetic fields outwardly therefrom. Even home computers today operate at clock speeds of 1 GHz or higher. Other specialized computing devices operate at even higher speeds. The high frequency signals input to and output from an IC pass across the chip leads. Longer package leads result in a more severe "antenna" effect, and thus, more intense electromagnetic interference (EMI).

As is known, EMI is disruptive to the proper operation of other circuit components proximately located to the source of the EMI. Accordingly, there is an identifiable need to reduce the levels of EMI generated. As is further known, this may be achieved by reducing the lead length of integrated circuit components. Area array packages, such as land grid array (LGA) packages, are a known package style that have a lessened radiation of EMI because of much shorter lead length.

LGA packages are devices without terminations on the bottom. The easiest way to envision an LGA device is to picture a semiconductor device with nothing but tiny round gold plated contact pads on the bottom. Typically, LGA packages connect to a printed circuit board (PCB) through a socket beneath the packages. The area array reduces package size and increases lead pitch, leading to higher assembly yields. More particularly, an LGA is a type of packaged integrated circuit in which one or more integrated circuit chips are mounted on a surface of a substrate, and electrical connection to electrically conductive material not part of the packaged integrated circuit, such as a PCB, is made by an intermediary device or socket with pins, springs, or something that can spring up and make contact with the contact pads located on a surface of the substrate opposite the surface to which the integrated circuit chip or chips are attached. The integrated circuit chip or chips are typically encapsulated by, for instance, plastic to protect the integrated chip or chips from the external environment. The integrated circuit chip is electrically connected to the substrate by wirebonding, tape-automated bonding, or flip-chip interconnection. LGAs allow a high density of external chip connections to be made as compared to other packaged integrated circuits having leads extending from the package periphery.

Flip chip interconnect technology supports "area array interconnect," in which the chip is typically mechanically and electrically connected through an array of solder bumps on the active face of the chip. This technique increases the number of connections that can be made for a given chip size and can also improve electrical performance by reducing inductance and capacitance. The chip is attached to the substrate face down and is typically reinforced with an epoxy underfill.

From a manufacturing point of view, LGA packages have many virtues. An LGA-packaged device can pack the same processing power as a peripherally leaded quad flat pack (QFP)-packaged device in less volume, making LGA chips thinner and lighter. LGA also offer designers flexibility, allowing them to maximize the density of connections per chip to improve high-frequency operation.

Unfortunately, the dense array of contact pads makes testing the modules very difficult. The difficulty is increased where the module must be attached to another device, such as a PCB, for testing. For example, some modules must be attached to the system board before they can be completely tested. Testing these modules requires access to the contact pads be provided while the module is attached to the system board. Unfortunately, it is especially difficult, and in some cases impossible, to probe the input/output contact pads on the module when it is attached to the system board because the body of the module and the system board block access to the contact pads.

In the past, one way designers used to test and debug LGA modules was to form testing contact pads into the system board that provide contact points to the contact pads. Unfortunately this requires additional real estate on the system board, an unacceptable solution in many cases. Additionally, these types of landing pads generally require a specialized and expensive probing tool with a long lead-time required to build it.

Another method designers have used to debug and develop LGA packaged devices was to package them in a simplified package such as a pin grid array package (PGA), with the input/output connections through standard pinouts and then design and build a specialized test system board that is used only for debugging and testing. This specialized test system board would be similar to the normal system board, but with the design changes necessary to use the PGA modules instead of the LGA module. The designer could then use an interface card to connect to the specialized test system board to the overall system for testing.

The specialized test system board would be specially designed to provide landing pads for test probes that can be used to provide access to the contact pads and connect to a logic analyzer and/or other measurement devices. Thus, the designer was able to access the contact pads on the LGA module and test the module while it is connected to the overall system through the test PCB. Unfortunately, designing and building a specialized PGA package and a specialized test system board simply for the testing of the module was exceedingly time consuming and expensive. In particular, it requires the design and development of two packages, a test PGA package and an LGA module used for final packaging. Additionally, it requires special boards to be designed. The specialized test system board with its extra landing pads for testing and the normal system board without the landing pads that will be used in the final product.

Thus, what is needed is a method and apparatus to provide debugging and testing of LGA modules while on the system board or other packaging that does not require the specialized test packages or specialized test system boards, and this new LGA package does not require the use of valuable real estate on the system board for testing contact pads.

BRIEF SUMMARY OF THE INVENTION

The present invention relates to a method and apparatus that allows additional contact pads to be added to a package to support debug and test operations. Preferably, the additional contact pads are added to the top surface of the LGA, so as not to utilize precious contact area on the bottom surface of the LGA. Furthermore, the top surface contact pads possess the same contact density, signal integrity, and reliability as the bottom surface contact pads, without degrading the bottom surface contacts pads' characteristics in any way.

In a preferred embodiment, a circuit board apparatus includes a semiconductor package and an interposer for receiving the semiconductor package. The semiconductor package preferably includes a substrate having a matrix of conductive contact pads on both the top and bottom surfaces of the substrate. The interposer preferably includes a body having a matrix of contact bumps that provide an electrical path from the LGA package to the PCB. Each interposer contact bump includes electrically conductive surfaces that are shaped to abut a contact pad of the LGA package and a contact pad on the PCB.

In another preferred embodiment, a circuit board apparatus includes a semiconductor package, an interposer, a heat sink and a gasket. The heat sink preferably absorbs or dissipates any excess heat generated by the semiconductor package. The gasket preferably provides sufficient force to the second PCB to create contact between the PCB pads and the LGA pads via the interposer.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
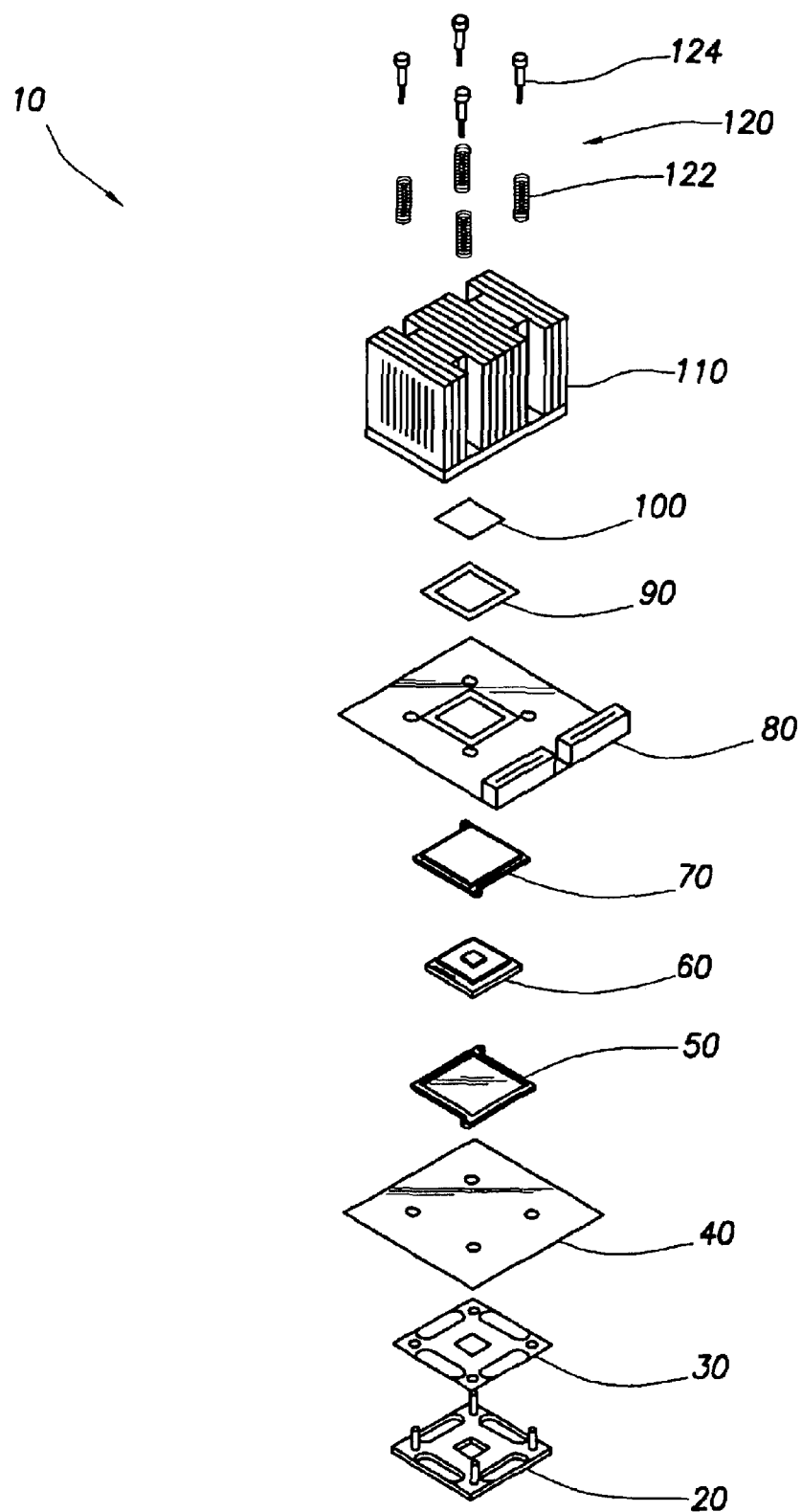
FIG. 1 is an exploded 3D assembly view of a system in accordance with a preferred embodiment of the present invention.

Referring initially to FIG. 1, an exploded view of a system 10 in accordance with a preferred embodiment is shown. System 10 preferably comprises a backing plate 20, an insulator 30, a first (or bottom side) printed circuit board (PCB) 40, a first (or bottom side) interposer 50, a land grid array (LGA) package 60, a second (or top side) interposer 70, a second (or top side) PCB 80, a compression pad or gasket 90, a thermal interface 100, and a heat sink 110. As is known in the art, heat sink 110 is held in place by a mechanism such as a spring-loaded fastening assembly 120 in such as manner as to achieve thermal contact therewith. Spring-loaded fastening assembly 120 generally includes a plurality of springs 122 and cap screws 124. In a preferred embodiment, thermal interface 100 comprises a material such as thermal grease to enhance the flow of heat from the package 60 into heat sink 110. Preferably a dielectric insulating material such as a thermoplastic 30 is used to electrical isolate the backing plate 20.

Figure 2:
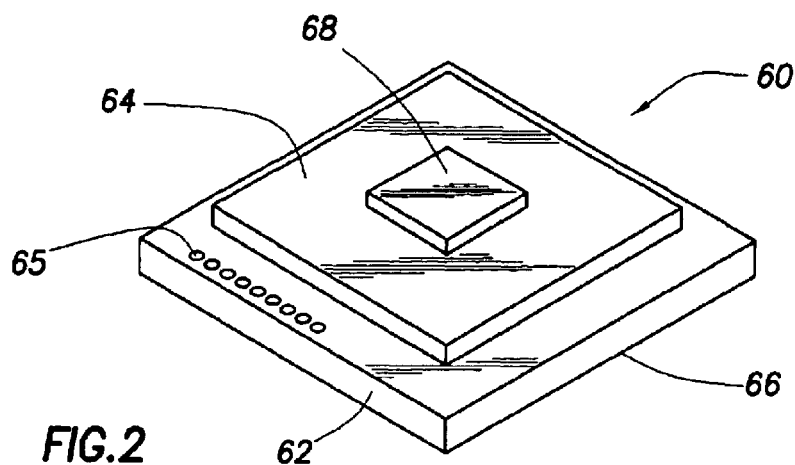
FIG. 2 is a perspective view of a package in accordance with a preferred embodiment of the present invention.

Referring now to FIG. 2, package 60 comprises a substrate 62, a lid or heat spreader 64, top surface contact pads 65, and bottom surface contact pads 66 (not shown). Package 60 also contains a semiconductor chip 68. In a preferred embodiment, lid 64 is cantilevered on the chip 68. The substrate 62 can comprise any type of substrate material. For example, the substrate 62 can be comprised of a material such as ceramic, printed circuit board, or fire-retardant epoxy-glass cloth. The contact pads 65 are fabricated onto the top surface of substrate 62.

In a preferred embodiment, contact pads 65 are used for debugging and test operations, and also may be used for other functions. Bottom surface 66 contact pads are preferably designed for production use. Each contact pad 65 connects to a top side interposer 70 inner contact bump (not shown). These connections are preferably silver particles imbedded in a polymeric material and mounted in an insulating (ie., elastomeric) material, but could suitably be formed by any electrically conductive spring connection mechanism.

Figure 3:
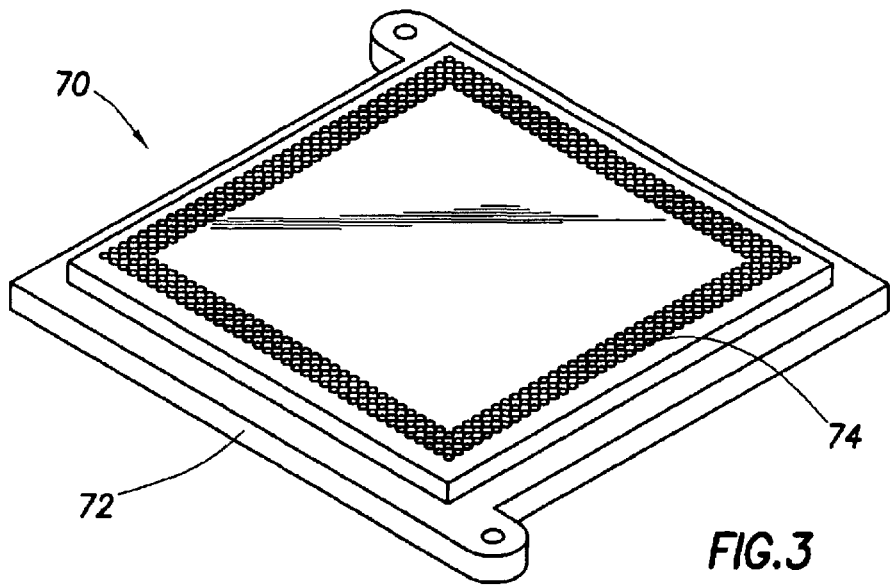
FIG. 3 is a perspective view of an interposer in accordance with a preferred embodiment of the present invention.

Referring now to FIG. 3, interposers 50, 70 preferably comprise semiconductor connection mechanisms with footprints similar to that of substrate 62. In particular, interposers 50, 70 preferably comprise inner contact bumps and outer contact bumps 74. The inner contact bumps are located on the inner surface of the interposer 50, 70, which is herein defined as the surface adjacent to the package 60, and more specifically, the top pads 65 and the bottom pads 66 on the substrate 62. The outer surface and outer contact bumps 74 are adjacent to the PCBs 40, 80. The contact bumps 74 provide interconnection with package 60 and PCBs 40, 80. In some embodiments, the number of contact bumps 74 may exceed the number of pad connections. This approach is useful for easing the manufacturing process.

The body 72 of interposers 50, 70 preferably harbors the ceramic or circuit board material. The thickness of the interposers 50, 70 body can be adjusted to eliminate interference between the package 60 and other elements of the system 10. In a preferred embodiment, the inner contact pads are arranged in the same pattern, same pitch, and spacing as the contact pads 65, 66 on substrate 62.

In a preferred embodiment, the contact pads 65, 66 possess a 1.27 mm pitch. Other pitches, including spacing as low as 1 mm or lower, could also be used. The substrate 62 preferably allows for, but is not limited to, 1443 pins or signals In addition to interconnecting with system 10, PCB 80 may contain logic and possess independent power sources (from the system 10 or other sources external to the package 60). While independent power is not required, it reduces the effect of external logic on the package 60. Also, PCB 80 can be used to supply additional power to the package 60, freeing contact pads previously used for power for critical system interface signals. An advantage of this approach is that by avoiding the congestion of system interface signals, power regulation can be closer to the point of use than in traditional designs.

Figure 4:
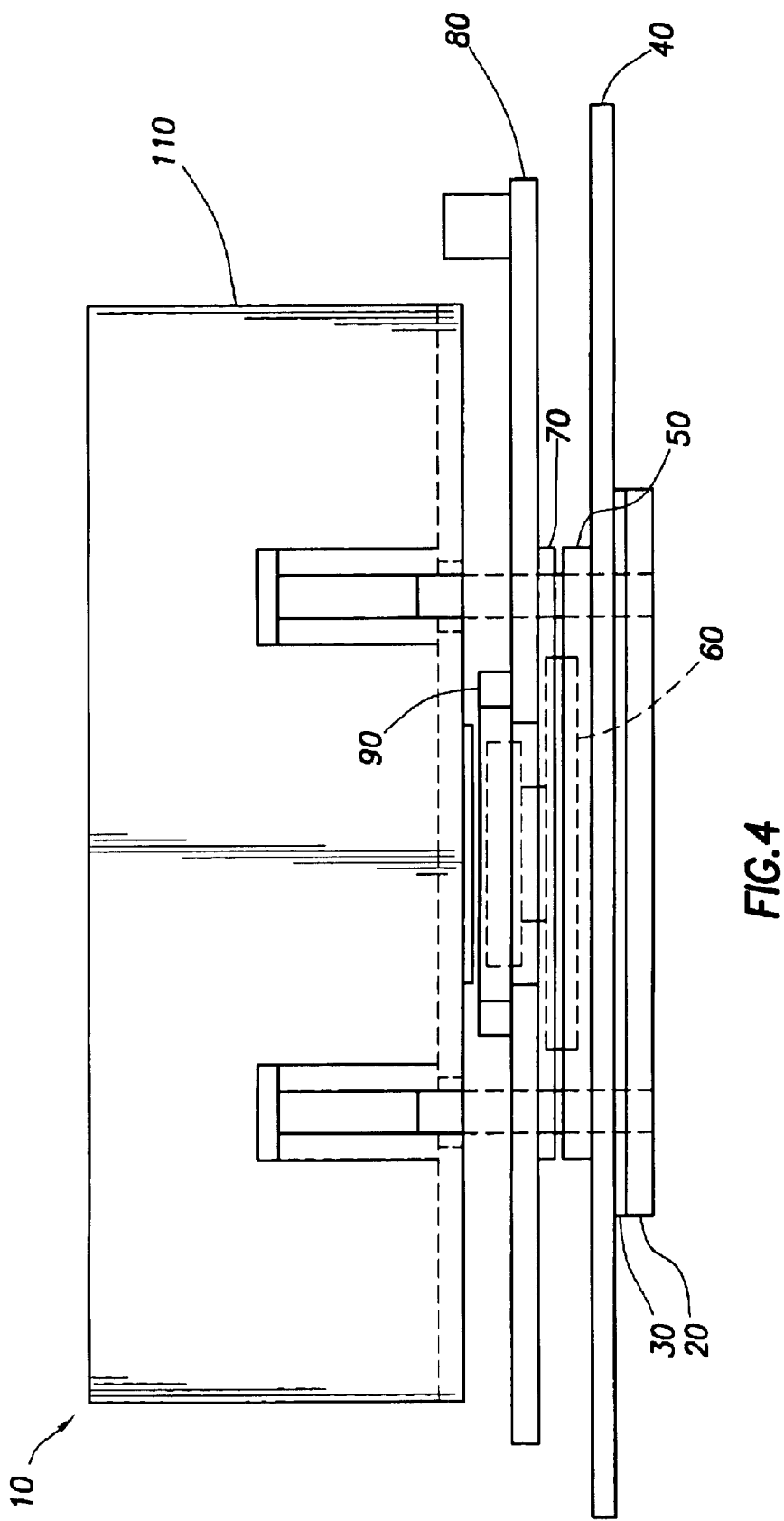
FIG. 4 is a side view of an assembled system in accordance with a preferred embodiment of the present invention.

Additionally, PCB 80 may contain cutouts (not shown) to enable any package 60 features (i.e., decoupling capacitors) to remain in their normal positions. In some embodiments, the enclosed package 60 top or lid 64 protrudes though PCB 80. Referring now to FIG. 4, a side view of system 10 is shown assembled. When all the components of system 10 are assembled together, the back plate 20 is assembled onto the insulator 30, bottom PCB 40, bottom interposer 50, LGA 60, top interposer 70, top PCB 80, Gasket 90, Thermal Interface 100, and Heat sink 110. The cap screws 124 are assembled to the springs 122, through the heat sink 110, and in turn assembled to the back plate 20. During this assembly procedure, the heat sink 110 compresses onto the thermal interface 100 which in turn applies pressure to the LGA 60. The LGA 60 also compresses onto the bottom interposer 50 which in turn compresses against the $1^{st}$ PCB 40. The bumps 74 of the $1^{st}$ interposer 50 are compressed between the LGA pads 66 and the $1^{st}$ PCB 40, and contact is made between the LGA 60 and the $1^{st}$ PCB 40. The heat sink 110 also compresses against the gasket 90. The gasket 90 applies pressure to the $2^{nd}$ PCB 80 which in turn applies pressure to the $2^{nd}$ Interposer 70. The bumps 74 of the $2^{nd}$ interposer 70 are compressed between the LGA top pads 65 and the $2^{nd}$ PCB 80, and contact is made between the LGA 60 and the $2^{nd}$ PCB 70.

Figure 5:
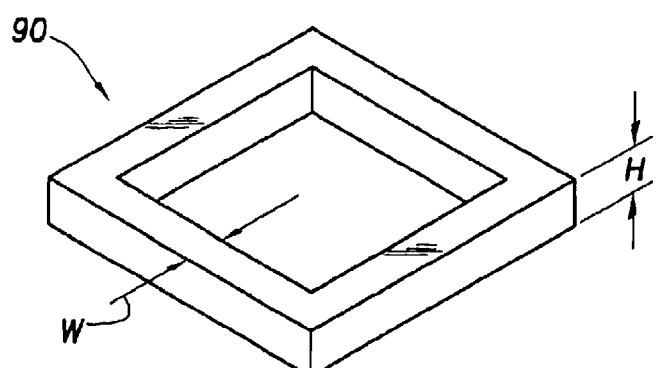
FIG. 5 is a perspective view of a gasket in accordance with a preferred embodiment of the present invention.

Referring now to FIG. 5, the gasket 90 compression is preferably tailored to the system 10. If the gasket 90 is too soft, it will not apply the appropriate force to the outer contact pads 74 of the interposer 70, and the outer contact pads 74 will have improper electrical continuity. If the gasket 90 is too hard, the entire load is transferred from the heat sink 110 directly to the gasket 90 and the perimeter of the package 60. As a result, the pressure between the heat sink 110 and the lid 64 of the package 60 will be very low, resulting in inadequate cooling of the chip. The force applied through the gasket 90 and eventually to the outer contact pads 74 of the interposer 70 cannot be too large or small in order for system 10 to work efficiently. Furthermore, it is preferred that the gasket 90 behaves elastically.

In a preferred embodiment, the gasket 90 comprises a sponge, preferably a silicon sponge. The gasket 90 preferably has a Young's modulus in the range of 100 to 200 kpsi. It is believed that the gasket 90 behaves elastically up to 50% compression. In one embodiment, the gasket's width W (along the perimeter) is 0.150 inch and the height H is in the range of 0.125 to 0.1875 inches. When fully assembled, the gasket 90 is compressed approximately 20 to 40% of the original height.

The interposers 50, 70 and gasket 90 preferably minimize the air gap between the components of system 10. By using identical interposer technology on both the top 65 and bottom surfaces of the package 60, equivalent contact density, mechanical integrity, and electrical qualities are achieved on both surfaces.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit board apparatus comprising:

a semiconductor package defined by a substrate having a matrix of conductive contact pads on both the top and bottom surfaces of the substrate; and two interposers for receiving said semiconductor package, each interposer defined by a body having a matrix of interposer contact bumps on both the inner and outer surfaces of the body, each interposer contact bump comprising an electrically conductive path and shaped to abut a contact pad of said semiconductor package and a contact pad of a printed circuit board, wherein the inner surface of one of the interposers is adjacent to the top surface of the substrate and the inner surface of the other interposer is adjacent to the bottom surface of the substrate.

2. The apparatus of claim 1 wherein the contact pads of the semiconductor package are uniformly spaced.

3. The apparatus of claim 1 wherein the semiconductor package is a land gild array package.

4. The apparatus of claim 1 wherein the contact bumps of at least one of the interposers are uniformly spaced.

5. The apparatus of claim 1 wherein the contact pads on the top surface of the semiconductor package support debugging and test operations.

6. The apparatus of claim 5 wherein the contact pads on the bottom surface or the semiconductor package are designated for production operations.

7. The apparatus of claim 1 wherein the interposer contact bumps on the inner surface of at least one of the interposers are arranged in the same pattern, pitch end spacing as the contact pads on the top surface of the semiconductor package.

8. The apparatus of claim 7 wherein the semiconductor package contact pads have a 1.27 mm pitch or smaller.

9. The apparatus of claim 1 wherein the substrate supports 1443 signals to be collected.

10. A circuit board apparatus comprising:

a semiconductor package defined by a substrate having a matrix or conductive contact pads on both the top and bottom surfaces of the substrate; and two interposers for receiving said semiconductor package, each interposer defined by a body having a matrix of interposer contact bumps on both the inner and outer surfaces of the body, each interposer contact bump comprising an electrically conductive path and shaped to abut a contact pad of said semiconductor package and a contact pad of a printed circuit board wherein the number of interposer contact bumps on the inner surface of at least one of the interposers exceeds the number of contact pads on the top surface of the semiconductor package.

11. A processor comprising:
- a substrate having a matrix of conductive contact pads on the bottom surface of the substrate and a test port on the top surface of the substrate;
- a first interposer disposed adjacent to the top surface of the substrate and coupled to the test port; and
- a second interposer disposed adjacent to the bottom surface of the substrate and coupled to the conductive contact pads.

12. The processor of claim 11 wherein the test port comprises a conductive contact pad.

13. The processor of claim 11 wherein the test port is designated for debugging and test operations.

14. The processor of claim 11 wherein the contact pads on the bottom surface of the processor are designated for production operations.

15. The processor of claim 11 wherein the test port on the top surface of the substrate possesses approximately the same contact density as the contact pads on the bottom surface of the substrate.

16. The processor of claim 11 wherein the test port on the top surface of the substrate possesses approximately the same signal integrity as the contact pads on the bottom surface of the substrate.

17. The processor of claim 11 wherein the test port on the top surface of the substrate possesses approximately the same reliability as the contact pads on the bottom surface of the substrate.

* * * * *